United States Patent [19]

Feuerbaum et al.

[11] Patent Number: 5,041,724
[45] Date of Patent: Aug. 20, 1991

[54] METHOD OF OPERATING AN ELECTRON BEAM MEASURING DEVICE

[75] Inventors: Hans-Peter Feuerbaum, Munchen; Jürgen Frosien, Ottobrunn, both of Fed. Rep. of Germany

[73] Assignee: ICT Integrated Circuit Testing Gesellschaft Fur, Halbleit Erpruftechnik mbH, Fed. Rep. of Germany

[21] Appl. No.: 419,458

[22] Filed: Oct. 10, 1989

[30] Foreign Application Priority Data

Nov. 24, 1988 [DE] Fed. Rep. of Germany ....... 3839707

[51] Int. Cl.$^5$ ............................................. H01J 37/26
[52] U.S. Cl. .................... 250/307; 250/306; 250/310
[58] Field of Search ............... 250/307, 306, 305, 310, 250/311, 423 P, 492.2; 313/542

[56] References Cited

U.S. PATENT DOCUMENTS

| 2,243,362 | 5/1941 | Sukumlyn | 250/307 |
| 3,864,572 | 2/1975 | van der Mast et al. | 250/306 |
| 4,096,386 | 6/1978 | Rempfer et al. | 250/306 |
| 4,667,101 | 5/1987 | Siekhaus | 250/307 |
| 4,764,674 | 8/1988 | Kinoshita | 250/306 |

Primary Examiner—Jack I. Berman
Assistant Examiner—Kiet T. Nguyen
Attorney, Agent, or Firm—Learman & McCulloch

[57] ABSTRACT

In modern electron beam measuring devices the thermal La/B6 or field emission source is replaced by a photocathode acted upon by a pulsed laser beam. Since the width of photoelectron pulses corresponds approximately to the width of the laser pulses, theses devices are particularly suitable for stroboscopic measurements in fast gallium arsenide circuits. The expenditure on apparatus for generating the photoelectron pulses is considerable since means for doubling the frequency of the primary laser light are necessary. It is therefore proposed to irradiate the cathode of the electron beam measuring device with photons of energy $E_{Ph}<W$ (W:=electron work function of the cathode material) and to reduce the work function with the aid of an external electrical field to such an extent that photoemission occurs, but not field emission.

13 Claims, 2 Drawing Sheets

METHOD OF OPERATING AN ELECTRON BEAM MEASURING DEVICE

BACKGROUND OF THE INVENTION

1. Technical Field

The invention relates to a method of operating an electron beam measuring device.

2. Related Art

An electron beam measuring device is known from Appl. Phys. Lett. 51 (2), 1987, pages 145 to 147 in which the thermal LaB6 or field emission source was replaced by a photocathode acted upon by a pulsed laser beam (pulse repetition frequency $\gamma = 100$ MHz, pulse width $\approx 1$ to 2 ps). Since the width of the photoelectron pulses which are generated corresponds approximately to the width of the laser pulses, this device is particularly suitable for stroboscopic measurements in fast gallium arsenide circuits. The expenditure on apparatus for generating the photoelectron pulses is, however, considerable. The frequency of the laser light ($\lambda = 1064$ nm) has to be doubled twice in order to release photoelectrons from the gold layer which acts as the cathode (work function of electrons $W = 4.5$ eV).

A scanning electron microscope is known from J. Phys. E: Sci. Instrum 20 (1987), pages 1491 to 1493 in which the tungsten cathode is heated with the aid of a pulsed laser beam within a few nanoseconds to temperatures above the melting point and is thereby stimulated to thermal emission of electrons. In this device too, doubling of the frequency of the primary radiation generated in a Nd-YAG laser is necessary. In addition, at higher laser energy levels a second electron pulse occurs which has to be screened out with the aid of a deflecting system. Also, because of the high evaporation rate of the cathode material the operational life of the cathode is limited.

SUMMARY OF THE INVENTION

The object of the invention is to provide a method of operating an electron beam measuring device with which photoelectron pulses can be generated without doubling the frequency of the primary laser light. In addition the probe current is to be markedly increased. This object is achieved according to the invention by irradiating the cathode with photons having an energy level lower than the electron work function of the cathode material and reducing the work function by means of an external electrical field to such an extent that photoemission occurs, but not field emission.

A particularly advantageous characteristic of the invention is that convention laser sources can be used to generate the photoelectron pulses.

THE DRAWINGS

THE PREFERRED EMBODIMENT

Figure 1:
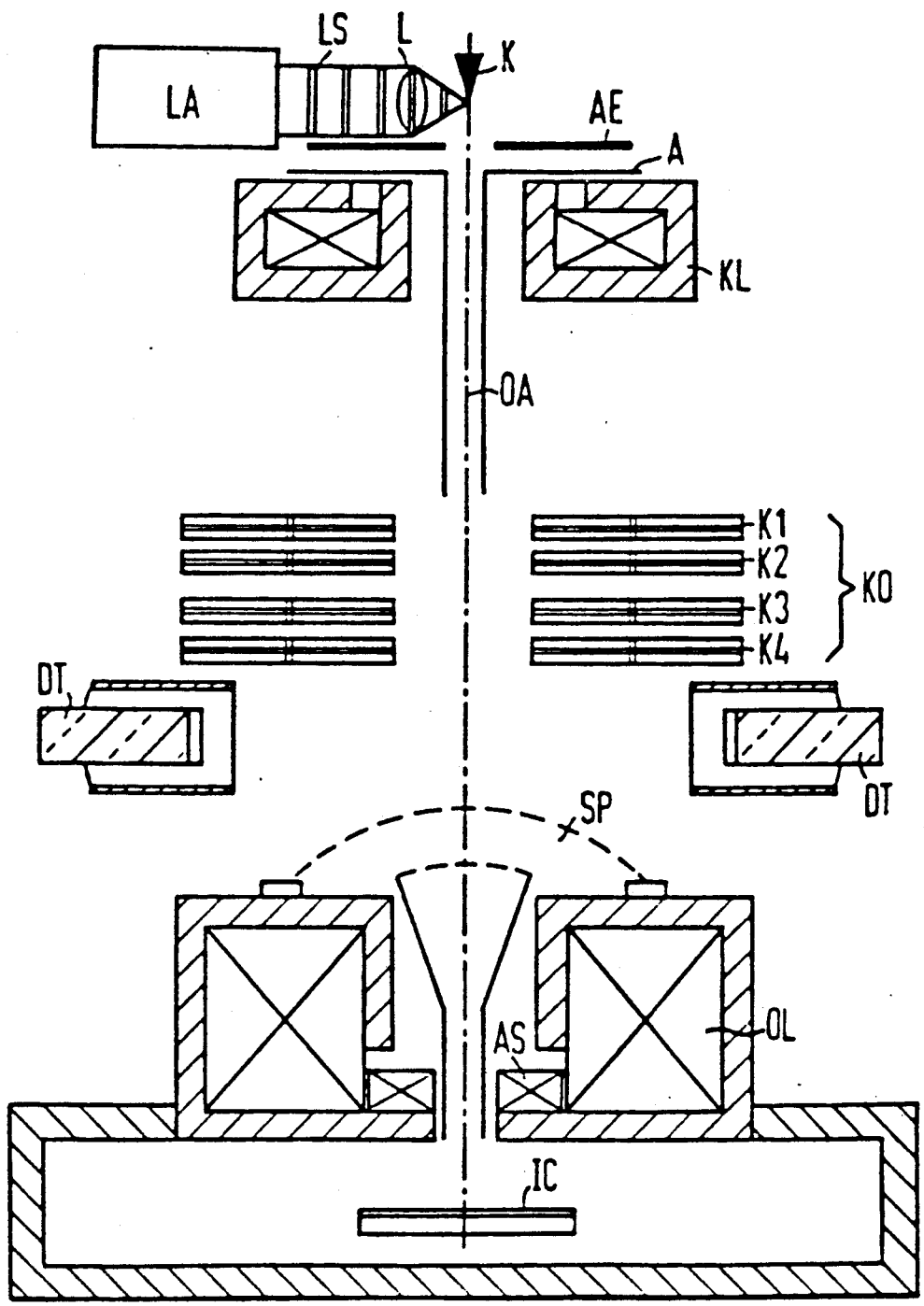
FIG. 1 shows an electron beam measuring device.

The electron beam measuring device which is schematically illustrated in FIG. 1 comprises a beam generator consisting of a field emission cathode K, an extraction electrode AE and an anode A, a laser source LA, particularly a Nd: YAG laser, an optical system L for focussing the laser radiation LS emitted in pulse form ($\lambda = 1064$ nm, pulse repetition frequency $\gamma = 100$ MHz) onto the cathode tip, a condenser lens KL, a corrector KO consisting of at least four eight-pole or twelve-pole elements K1 to K4 and an objective lens by means of which an intermediate image of the photoelectron source generated by the condenser lens KL is reproduced on a reduced scale on the component IC arranged in the evacuated test chamber. The objective lens, with which both the photoelectrons and also the secondary electrons released at a measuring point are each focussed in a point lying on the optical axis OA, consists essentially of a magnetic lens OL of short focal distance, a deflecting unit AS and a secondary electron spectrometer SP for determining the potential of the measuring point. The focus of the secondary electrons accelerated in the field of a collector electrode lies in the centre of a spherically symmetrical electrical opposing field which builds up between two approximately hemispherical electrodes in the part of the spectrometer arranged above the lens body. Secondary electrons with energy levels above a minimum energy level defined by the spectrometer field are detected in two detectors DT arranged symmetrically with respect to the beam axis OA.

Since the photon energy $E_{Ph} = 1.17$ eV ($\lambda = 1064$ nm) is not sufficient to release electrons from the tungsten cathode K (tip radius $r_o = 0.1$ to 0.5 $\mu$m, work function $W \approx 4.5$ eV) the potential barrier at the metal-vacuum boundary surface and thus the work function are reduced according to the invention with an external electrical field to such an extent that the condition $$W_{eff} \lesssim E_{Ph}$$

$W_{eff}$ = work function in the external field $E_{Ph}$ = photoenergy is fulfilled. The external field is produced with the aid of the extraction electrode AE which is positively charged by contrast with the cathode K. The potential thereof is predetermined so that photoemission takes place, but no field emission ("field-assisted photoemission"). The field strength in the region of the cathode tip should not therefore exceed the critical value of approximately $10^6$ to $10^7$ V/cm. The extraction potential is determined by the photon energy, i.e. the type of laser LA used, and the geometric conditions within the electron gun (tip radius of the cathode, distance of cathode K—extraction electrode AE). In order for the sample IC lying at earth potential to be irradiated with electrons of energy $E_{PE} = 1$ kV, a potential $U_K = -1$ kV can be applied for example to the cathode K, a potential $U_{AE} = 0.5$ to 6 kV can be applied to the extraction electrode AE, and a potential $U_A = 0$ kV can be applied to the anode A. It is of course also possible for the photoelectrons to be accelerated first of all to a high energy level of for example $E_{PE} = 10$ keV ($U_A = 9$ kV) in order that they can then be retarded below the electron gun with the aid of an additional electrode or an immersion condenser to the desired final energy level.

Figure 2:
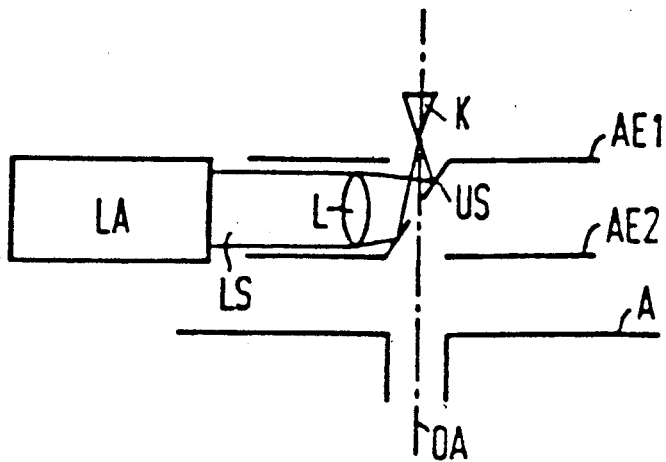
FIGS. 2 and 3 show an electron gun.

In the electron gun illustrated in FIG. 2 the laser light LS is focussed on the tip of the cathode with the aid of a lens L and a flat or parabolic mirror US. The mirror US which is provided with a recess for the photoelectrons to pass through is arranged between two extraction electrodes AE1 and AE2 both at the same potential $U_{AE}$. This electron gun has the advantage over the system shown in FIG. 1 that the photoelectrons are emitted predominantly in the direction of the optical axis OA of the electron beam measuring device.

Figure 3:
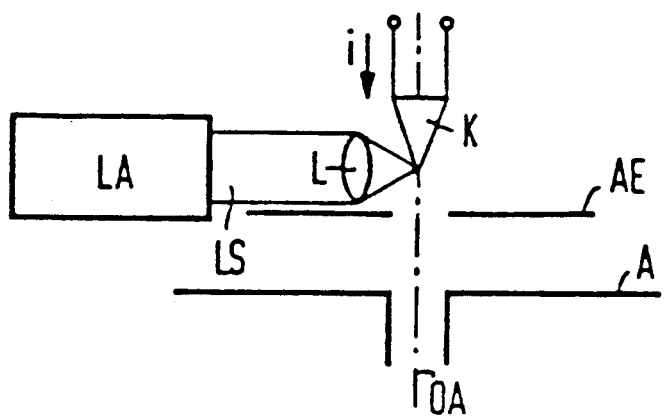

FIG. 3 shows an electron gun in which the cathode K is brought with the aid of a heating current i to a temperature at which photoemission takes place but not thermal emission ("thermally assisted photoemission"). The heating current i should therefore be set so that the cathode temperature remains below the value of approximately 2000 K which is critical for thermal emission. Again, the photoemission can be assisted by the electrical field generated by the extraction electrode AE. Of course, it is also possible to focus the laser light LS onto the cathode K with the aid of the optical system L/US shown in FIG. 2.

In order to increase the probe current, the electron beam measuring device is equipped with a corrector KO consisting of at least 4 eight-pole or twelve-pole elements K1 to K4. This multi-pole optical system is known from Optik 34, Vol. 3 (1971) pages 285 to 311 (see in particular page 3 and 8, FIG. 9) and the Proceedings of the 9th International Congress on Electron Microscopy, Toronto 1978, Vol. 3, pages 186 to 196, and serves for correction of the axial chromatic aberration and/or axial spherical aberration of the objective lens, so that with the same resolution substantially greater apertures $\alpha$ can be permitted. Since the probe current $i_{PE}$ is proportional to the square of the objective lens aperture $\alpha$, which can be increased by a factor of approximately 10 with the use of a corrector KO, the probe current $i_{PE}$ increases according to the equation $i_{PE} \sim \alpha^2$ by a factor of 100.

Figure 4:
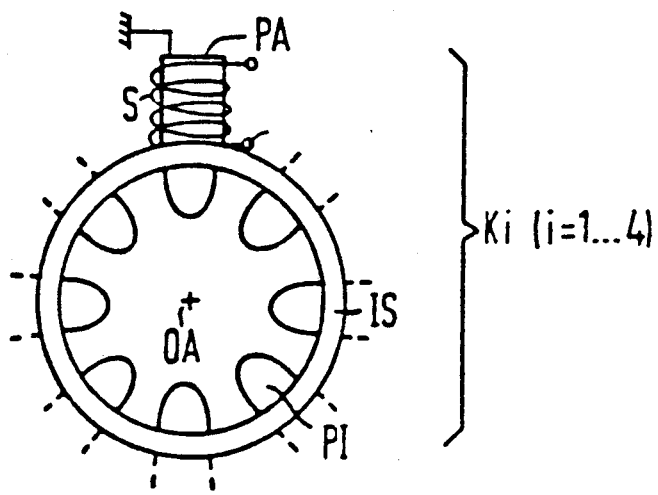
FIG. 4 shows an element of a multipole optical system for correcting the spherical aberration and/or chromatic aberration of an objective lens.

An element Ki (i=1 to 4) of the corrector KO. which is preferably arranged directly above the objective lens, is shown schematically in FIG. 4. It consists of eight inner pole shoes PI which lie at the potential $U_A$ of the anode A and are separated by a cylindrical insulator IS from the outer pole shoes PA which lie at earth or earth potential and are surrounded in each case by an exciting coil S. Magnetic quadrupole and octupole fields are generated in each of the elements Ki to produce a correction of the spherical aberration of the objective lens. For correction of the chromatic aberration electrical quadrupole fields are built up by applying corresponding additional potentials to the inner electrodes PI of the two central multipole elements K2 and K3 of the corrector KO.

Four eight-pole or twelve-pole elements Ki are sufficient in order to correct the axial spherical and chromatic aberration of the objective lens. The use of five elements additionally offers the possibility of reducing the off-axial lens aberrations. With the correction of the spherical aberrations of the third order, the spherical aberrations of the fifth order which increase with the distance between the corrector KO and the objective lens ML limit the resolution. Their influence can also be considerably reduced by the use of twelve-pole elements without restricting the corrections of lower orders.

Naturally, the invention is not limited to the embodiments which have been described. For instance the method can also be used in particular in a scanning electron microscope.

We claim:

1. In a method of operating an electron beam measuring device to irradiate a sample, said device having a cathode acted upon by a photon beam to release electrons, an anode for accelerating electrons released from the cathode along an optical axis, and an objective lens and a detector for detecting secondary particles released from said sample, the improvement comprising irradiating said cathode with photons having an energy level lower than the electron work function of the material from which said cathode is formed and in the presence of an external electrical field of such strength that photoemission occurs but not field emission.

2. The method according to claim 1 including heating said cathode, and limiting the temperature to which said cathode is heated to a level at which no thermal emission occurs.

3. The method according to claim 1 or 2 wherein the irradiation of said cathode is achieved by photons emitted in pulsed form.

4. The method according to claim 1 or 2 wherein said photons are emitted in the direction of an optical axis.

5. The method according to claim 4 including reflecting said photons in the direction of said axis.

6. The method according to claim 5 including positioning a reflecting mirror in the path of said beam and between first and second extraction electrodes.

7. The method according to claim 1 or 2 wherein said cathode is in the form of a tip.

8. The method according to claim 1 or 2 including correcting chromatic aberrations of said beam.

9. The method according to claim 1 or 2 including correcting spherical aberrations of said beam.

10. The method according to claim 1 or 2 including correcting spherical aberrations of said beam a multiple optical system.

11. The method according to claim 10 wherein said multiple optical system employs at least four eight-pole elements.

12. The method according to claim 10 wherein said multiple optical system employs at least four twelve-pole elements.

13. In a method of operating an electron beam measuring device to irradiate a sample, said device having a cathode acted upon by a photon beam to release electrons, an anode for accelerating electrons released from said sample along an optical axis, and an objective lens and a detector for detecting secondary particles released from said sample, the improvements comprising irradiating said cathode with photons having an energy level lower than the electron work function of the material from which said cathode is formed, and heating said cathode to a temperature at which photoemission occurs but no thermal emission occurs.

* * * * *